United States Patent [19]

Button et al.

[11] Patent Number: 5,789,347

[45] Date of Patent: Aug. 4, 1998

[54] METHOD OF PRODUCING HIGH-TEMPERATURE SUPERCONDUCTING MATERIALS

[75] Inventors: Timothy W. Button, Knowle; Neil McN Alford, London; Felicitas Wellhofer, Moseley, all of United Kingdom

[73] Assignee: Illinois Superconductor Corporation, Mt. Prospect, Ill.

[21] Appl. No.: 794,038

[22] Filed: Feb. 3, 1997

Related U.S. Application Data

[63] Continuation of Ser. No. 715,081, Sep. 19, 1996, abandoned.
[51] Int. Cl.$^6$ ............................................. H01L 39/24
[52] U.S. Cl. ............... 505/450; 505/452; 505/733; 505/742; 505/500; 427/62
[58] Field of Search .................................. 505/450, 452, 505/733, 742, 126, 500; 427/62

[56] References Cited

U.S. PATENT DOCUMENTS 4,994,437  2/1991  Torii et al. ........................ 505/1

FOREIGN PATENT DOCUMENTS 0 319 807  6/1989  European Pat. Off. .
0 337 656  10/1989  European Pat. Off. .

OTHER PUBLICATIONS

Abell et al., "Critical Currents, Magnetisation, AC–Susceptibility and AC–Losses in Ceramic Superconductors," Birmingham University Consortium on High–Tc Superconductors, University of Birmingham, U.K.; and ICI plc, Runcorn, U.K (1988). No page number.

Abell et al., "High Critical Currents in Thick Films of YBCO Showing Spherulitic Growth Habits," *Physica* C162–164, pp. 1265–1266 (1989).

Abel et al., "Textured Superconducting Thick Films of $YBa_2Cu_3O_{7-x}$," School of Metallurgy, University of Birmingham, U.K.; Department of Physics, University of Warwick, U.K.; and Department of Physics, University of New South Wales, Australia (1989). No page number.

Alford et al., "Low surface resistance in $YBa_2Cu_3O_x$ melt-processed thick films," *Nature*, vol. 349, No. 6311, pp. 680–683 (1991).

Alford et al., "Low Surface Resistance YBCO Thick Films," ICI, The Heath, Runcorn, Cheshire, WA7 4QE; and Dept. of Physics, College of William and Mary Williamsburg, Virginia 23185 (1991). No page number.

Alford et al., "Magnetisation measurements on melt–textured $YBa_2Cu_3O_{7-\delta}$," *Supercond. Sci. Technol.*, vol. 4, pp. S238–240 (1991).

Alford et al., "Processing, properties and devices in high–$T_c$ superconductors," ICI Advanced Materials, PO Box 11, The Heath, Runcorn WA7 4QE, U.K., pp. 1–7 (1990).

Alford et al., "Surface Resistance of Bulk and Thick Film $YBa_2Cu_3O_x$," ICI Advanced Materials; AT&T Bell Laboratories; Department of Electrical and Electronic Engineering, UMIST; Department of Physics, Oliver Lodge Laboratory, Liverpool University; Birmingham University; and National Physical Laboratory (1990). No page number.

(List continued on next page.)

*Primary Examiner*—Roy V. King
*Attorney, Agent, or Firm*—Marshall, O'Toole, Gerstein, Murray & Borun

[57] ABSTRACT

A method of producing ceramic superconducting materials such as $YBa_2Cu_3O_x$ includes blending together starting materials for the superconducting material. The blend of starting materials are formed into a layer and sintered at a temperature above the peritectic temperature for the superconducting material. Prior to sintering, the starting materials for the superconducting material may be unreacted. The starting materials may also be partially reacted prior to sintering by calcining for a period of time at a temperature which does not result in full reaction of the starting materials to the chemical composition of the desired superconducting material.

28 Claims, 1 Drawing Sheet

Button et al., "The Effect of Texturing on the Properties of High Tc Thick Films," ICI plc; and Superconductivity Research Group (1991). No page number.

Button et al., "The Processing and Properties of High $T_c$ Thick Films," ICI Advanced Materials; and University of Birmingham Superconductivity Research Group; ASC Snowmass (1990). No page number.

Cheng et al., "The effect of porosity on the superconducting properties of $YBa_2Cu_3O_x$ ceramic," *Supercond. Sci. Technol.*, vol. 1, pp. 113–117 (1988).

Day, Michael J., "Fabrication and Characterisation of High-Temperature Superconducting Thick Films," School of Metallurgy and Materials, University of Birmingham, (Oct. 1992). No page Number.

Gubser et al., "High-Capacity Superconducting Current Leads of $Y_1Ba_2Cu_3O_{7-x}$," *Journal of Superconductivity*, vol. 3, No. 2, pp. 221–226 (1990).

Khamas et al., "High-Tc Superconducting Short Dipole Antenna," *Electronic Letters*, vol. 24, No. 8, pp. 460–461 (1988).

Matthews et al., "Grain growth and seeding of thick films of $YBa_2Cu_3O_{7-\delta}$ on yttria stabilised zirconia," *Physica* C243, pp. 342–352 (1995).

Pollard et al., "Growth of quasi–single crystal superconducting $Y_1Ba_2Cu_{7-x}$ rods by melt processing," *Supercond. Sci. Technol.*, vol. 2, pp. 169–172 (1989).

Richardson et al., "An Alternator Using a High Temperature Superconductor for Field Excitation," NEI International Research & Development Co. Ltd.; University of Bath; and ICI Advanced Materials; pp. 202–203 (1989).

Shields et al., "Magnetic Properties of High Tc Superconductors," Department of Metallurgy and Materials, University of Birmingham (1988). No page number.

Wang et al., "Radio–frequency losses of $YBa_2Cu_3O_{7-\delta}$ composite superconductors," *Supercond. Sci. Technol.* vol. 1, pp. 24–26 (1988).

Wellhöfer et al., "Screen Printed HTC Superconducting Ceramics," Department of Metallurgy and Materials, University of Birmingham; Lucas Research Centre; and Department of Physics, University of Warwick (1989). No page number.

5,789,347

METHOD OF PRODUCING HIGH-TEMPERATURE SUPERCONDUCTING MATERIALS

CROSS-REFERENCE TO RELATED APPLICATION

Pursuant to 37 CFR 1.53(b)(1) and 35 U.S.C. 111(a), this is a continuation of U.S. Ser. No. 08/715,081, filed Sep. 19, 1996, now abandoned.

FIELD OF THE INVENTION

The present invention relates generally to high-temperature superconducting materials, and more particularly to methods of manufacturing structures including high-temperature superconducting materials which exhibit a low surface resistance.

BACKGROUND OF THE INVENTION

The discovery that certain ceramic materials, particularly copper oxides, exhibit superconductivity at above liquid nitrogen temperatures has stimulated intensive research. Many uses for such materials have been suggested and attempted, including, for example, devices operating with microwave or radio frequency signals such as antennas, magnetic resonance imaging pickup coils, resonators, and the like. Optimal performance of such devices may depend upon having the lowest possible surface resistance.

Low-surface resistance high-temperature superconducting materials have been successfully fabricated in the form of thin films of ceramic. Such films typically have a thickness on the order of 0.5 micron and are formed by depositing the ceramic material or its precursors on the surface of a planar, single crystal substrate using techniques such as co-evaporation, sputtering, laser ablation, and molecular beam epitaxy. The resulting thin films have a single crystal structure, which, owing to the absence of grain boundaries, exhibits a low-surface resistance. The techniques which are used to deposit a thin film of superconducting material are, however, expensive and require careful control. Moreover, it has proved extremely difficult, if not impossible, to form single crystal thin films of any appreciable size or to prepare such films on curved substrates such as fibers or tubes.

The techniques available for the production of superconducting "thick" films, i.e. films having a thickness greater than one micron and typically in the range of from 10–200 microns, from ceramic materials are relatively easy to control and enable films of relatively large surface area to be prepared on both planar and curved substrates. Such superconducting thick films may be formed by sintering or "melt-texturing" of a fully reacted or calcined ceramic material which has been deposited on a substrate. Under those processes, particulate starting materials may be blended together under high-shear conditions in order to produce a finely divided, homogeneous powder blend. This blending of the starting materials may be effected on a dispersion thereof in a liquid medium such as ethanol, which is then removed after the blending operation is complete. The constituents of the resulting powder blend are then reacted together by firing (a process called calcining), the temperature and duration of the firing process being selected so as to fully convert the starting materials into the ceramic material. After milling, the calcined ceramic material is formulated into a coating composition or ink, together with a vehicle which typically comprises a solution or dispersion of an organic polymeric material in a liquid solvent or dispersant. The coating composition is then used to deposit a layer of the ceramic material onto the substrate using techniques such as screen printing, painting, doctor blading and spin coating. Drying and sintering of the so-deposited layer at above the peritectic temperature (the temperature at which, upon cooling, a liquid phase combines with a solid phase to form a new solid phase) for the ceramic material yields the superconducting thick film.

As the material cools after sintering below the peritectic temperature, the microstructure consists of a random array of crystallites of small grain size. Films sintered at temperatures at or above the peritectic temperature consist of larger grains and possess a certain amount of preferred orientation, i.e. with the c-axis perpendicular to the substrate surface. Generally, the larger the grain size, the lower the surface resistance in the resultant superconducting thick film. The formation of larger grains may be accomplished by sintering the superconductor material above its peritectic temperature and cooling it relatively slowly. Increasing the melt time or slowing down the cooling process may be problematic, however, because the substrate may tend to react undesirably with the superconducting material. As a result, melt or sinter times, cooling times, and temperatures are limited, leading to superconducting thick films with many grain boundaries and having higher surface resistances.

SUMMARY OF THE INVENTION

In accordance with one aspect of the present invention, a method is provided for producing a ceramic superconductor material having a chemical composition and a peritectic temperature. The method includes blending together starting materials for the superconductor to produce a blend and forming the blend into a layer. The layer is heated to a first temperature, which is at least as high as the peritectic temperature of the ceramic superconductor material. At least a substantial portion of the starting materials is not fully reacted to the chemical composition of the superconductor material prior to the heating of the layer to the first temperature.

At least a substantial portion of the starting materials may be unreacted prior to the heating of the layer to the first temperature. All of the starting materials may be completely unreacted prior to the heating of the layer to the first temperature. The starting materials may be blended together by mixing the starting materials with a solvent and then drying to form a powder blend of starting materials.

The blend may be made into a partially reacted blend by heating to a second temperature for a period of time. The second temperature and time may be chosen such that at least a portion of the starting materials remains unreacted after such heating. The partially reacted blend may be mixed with a vehicle to form an ink blend, and the ink blend may be applied to a substrate to form the layer.

The layer may be heated from room temperature at about 10° C. per minute to the first temperature, and may be held at that first temperature for a period of time. The layer may then be cooled at about 2° C. per minute to room temperature.

A superconducting structure may be prepared by the method of the present invention and be subject to an electromagnetic field. A signal may be coupled from the superconducting structure.

In accordance with another aspect of the present invention, a method of producing $YBa_2Cu_3O_x$ is provided where x is between about 6.5 and about 7.2. The method includes blending together starting materials for the $YBa_2Cu_3O_x$ to form a blend and applying that blend to a substrate to form a layer. The layer is heated to a first temperature, which is at least as high as the peritectic temperature of $YBa_2Cu_3O_x$. At least a substantial portion of the starting materials are not fully reacted to $YBa_2Cu_3O_x$ prior to heating the layer to the first temperature. When the layer is heated, it may be heated in an atmosphere of oxygen at about one atmosphere.

In accordance with another aspect of the present invention, a method of producing $YBa_2Cu_3O_x$ superconductor material is provided where x is between about 6.5 and about 7.2. The method includes blending together $Y_2O_3$, $BaCO_3$, and CuO and applying the blend to a substrate to form a layer. The layer is heated to a first temperature, which is at least as high as the peritectic temperature of $YBa_2Cu_3O_x$. At least a portion of the $Y_2O_3$, $BaCO_3$, or CuO is not fully reacted to $YBa_2Cu_3O_x$ prior to heating the layer to the first temperature.

The blend may be made into a partially reacted blend by heating to a second temperature for a period of time. The second temperature and time are chosen such that at least a portion of $Y_2O_3$, $BaCO_3$, or CuO remain unreacted after such heating. The second temperature may be no more than about 920°–940° C., and the time may be no more than about 16 hours. In a preferred embodiment, the second temperature may be no more than about 900° C. In a further preferred embodiment, a second temperature may be no more than about 880° C. In yet another preferred embodiment, the second temperature may be no more than about 860° C.

The first temperature may be at least about 1025° C., and the heating to the first temperature may occur in one atmosphere of oxygen. The first temperature may be about 1050° C.

In accordance with another aspect of the present invention, an electromagnetic signal may be processed by creating a superconducting structure having a superconducting material with a chemical composition and a peritectic temperature. A superconducting material is made by blending together starting materials for the superconducting materials to produce a blend, forming the blend into a layer, and heating the layer to a first temperature, which is at least as high as the peritectic temperature of the superconducting material. At least a substantial portion of the starting materials is not fully reacted to the chemical composition of the superconducting material prior to the heating of the layer to the first temperature. The superconducting structure is placed in an electric field generated from the electromagnetic signal. A signal is then coupled from the superconducting structure.

Other features and advantages are inherent in the method of producing a superconducting material or will become apparent to those skilled in the art from the following detailed description.

DETAILED DESCRIPTION OF THE PREFERRED EMBODIMENT

Figure 1:
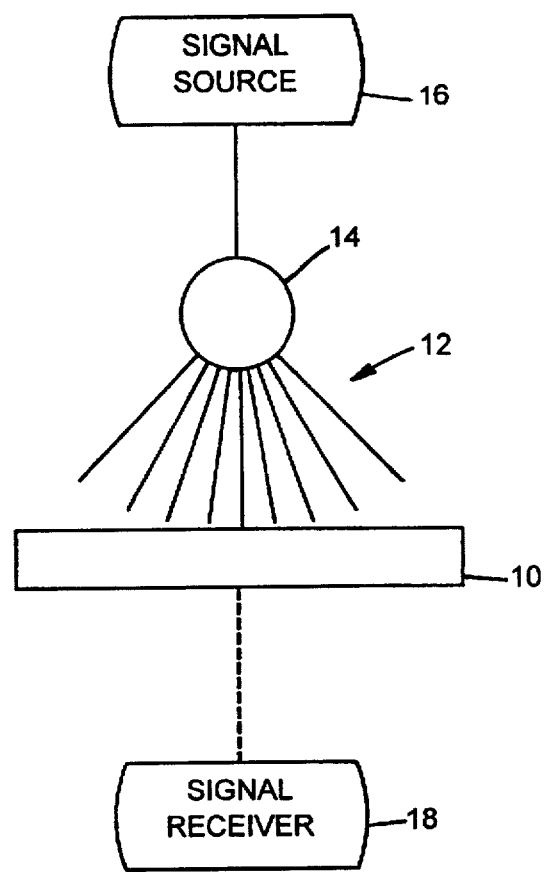
FIG. 1 is a block diagram showing a structure made in accordance with the method of the present invention being used in a device having an electromagnetic field.

The method of the present invention is designed to produce a layer of high-temperature superconducting material having a low surface resistance. Such material is desirable for use in an electromagnetic resonator, antenna, or other microwave or radio frequency devices which exhibit better performance using materials having lower surface resistance. While the method of the present invention may be used to manufacture superconducting materials having a variety of chemical compositions, it is preferably used in creating $YBa_2Cu_3O_x$, where x is between about 6.5 and about 7.2. Bismuth-strontium-calcium-copper oxides are also preferred. Barium copper oxides of various metals including neodynium, samarium, europium, gadolinium, dysprosium, holmium, erbium, thulium, ytterbium, and lutetium are also preferred.

Under the present method, unreacted starting materials, or materials which have not been fully reacted (i.e., partially reacted or unreacted) to form the chemical composition of the desired superconducting material, are sintered. As used herein, "starting materials" are those compounds which, when fully reacted or calcined under suitable conditions, will yield the desired superconducting material. A wide variety of starting materials may be used including carbonates, nitrates, alkoxides, and oxides of metals, and combinations thereof. When $YBa_2Cu_3O_x$ is prepared, a wide range of yttrium, barium, and copper compounds can be used as starting materials including the carbonates, nitrates, alkoxides, oxides of those metals, and combinations thereof. Conventionally, yttrium oxide ($Y_2O_2$), copper oxide (CuO), and barium carbonate ($BaCO_3$) are used as the starting materials for manufacturing $YBa_2Cu_3O_x$. As used herein, a "partially reacted material" is an intermediary product between the unreacted starting materials and the final chemical composition of the superconducting material. Such a partially reacted material may be formed by partially reacting the constituent starting materials, and may typically be a mixture of unreacted starting materials, the final ceramic material, and any intermediary compounds which are formed. Alternatively, a partially reacted material may be prepared by reacting together, either partially or fully, only some of the constituent starting materials, and then blending this product with the remaining starting material(s).

In contrast to prior art methods, unreacted starting materials, or at least starting materials having at least a substantial portion which has not been fully reacted, are sintered or melt-textured to form the superconducting ceramic material. A substantial portion of starting materials is a portion greater than the amount of starting materials present in superconducting material which has been fully calcined under prior art methods. Under such prior art methods, the superconducting material will be at least 90% phase-pure fully reacted material and usually 95%, 98%, or even 99% phase pure prior to sintering. Thus, under the methods of the present invention, the superconducting material will have more than 1%, 2%, 5%, 10%, or preferably even a higher percentage of unreacted or not fully reacted starting materials prior to sintering. Surprisingly, the processes of the present invention reliably lead to the formation of a superconducting thick film having an appreciably lower surface resistance than methods which sinter fully reacted materials. Without being bound to any one theory, it is believed that the method of the present invention produces lower surface resistance materials because the unreacted or partially reacted starting materials melt at a lower temperature, and thereby remain in a liquid phase for a longer period of time than would the fully reacted materials. The longer melt times lead to the formation of larger grains or crystallites in the resultant ceramic material after cooling. Larger grains or crystallites are believed to lead to lower surface resistance in ceramic superconducting material. The present method may also result in a certain amount of preferred orientation leading to a lower surface resistance.

A precursor layer for sintering, in accordance with the method of the present invention, can be prepared using techniques which are broadly similar to those used in the thick film ceramics art. In one embodiment, the particulate starting materials for a given ceramic material are blended together, preferably under high shear conditions, in order to produce a finely divided, homogeneous powder blend. This blending operation may be effected on a dispersion of the starting materials in a liquid medium such as ethanol. The ethanol may then be removed or dried after the blending operation is complete, e.g. by rotary evaporation. Vibro-milling is a particularly suitable technique for blending together the starting materials. The resulting blend may also be sieved and freeze dried for 12 hours. The resulting powder blend is then formulated into a coating composition or ink, together with a vehicle, such as a solution or dispersion of an organic polymeric material in a liquid solvent or dispersant. Where a liquid medium is used in the blending operation described above, the liquid may be of a type which is suitable as a solvent/dispersant in the coating composition, in which case the liquid may be retained, making the addition of a further liquid solvent or dispersant unnecessary.

The coating composition is then used to deposit a layer of the starting materials onto a supporting substrate using techniques such as screen printing, painting, doctor blading, dipping, and spin coating, to form a precursor layer. After the coating operation is complete, the solvent or dispersant may be removed from the precursor layer by drying at ambient temperatures or by forced evaporation, e.g. in a warm air oven. The dried layer may then be sintered directly or, alternatively, the sintering operation may be preceded by a lower temperature heat treatment designed to remove (e.g. burn-off) any organic polymer which may have been used in the coating composition. A temperature of around 500° C., which is well below the temperature employed for sintering, is generally sufficient to burn out any organic polymer.

In another preferred embodiment, the particulate starting materials for a given superconducting ceramic material are blended together as described above, and the resulting powder blend, after removal of any liquid medium used in the blending operation, is heat treated in order to partially react or calcine the starting materials. The partial reaction or calcination may take place on alumina boats placed in a calcination furnace. The partially reacted material thus formed, may be formulated directly into a coating composition or ink, together with a vehicle.

A vehicle for forming the coating ink may be made using ingredients in the following weight percents:

| | |
|---|---|
| Terpineol | 43.6% |
| 2-(2-Butoxy) Ethyl-Acetate (BCA) | 43.6% |
| Paraloid B-67 | 5.73% |
| Ehec-Hi Cellulose | 2.12% |
| T-200 Cellulose | 2.35% |
| N-4 Cellulose | 2.6% |

The Paraloid B-67 is dissolved in the Terpineol and 2-(2-Butoxy) Ethyl-Acetate (BCA) with a magnetic stirrer for 24 hours. The remaining ingredients are mixed together and slowly added to the solvent mixture and then left to dissolve while stirring for 12 hours.

The aforementioned particulate starting material powder is then hand mixed with the vehicle on an alumina plate, about 20% vehicle by weight to about 80% powder. The vehicle-powder mixture is milled on a three-roll mill with the gap between the back rollers set at 0.01 inches and the front rollers set at 0.001 inches. Each ink is passed through the mill rollers three times and then left to stand for 24 hours. The powder and vehicle may also be mixed with silver powder at about 2 weight percent of the superconductor powder to create the ink.

The coating composition comprising the partially reacted material is then used to deposit a layer of that material onto a supporting substrate using a suitable coating process. Suitable coating processes have been described above. After the coating operation is complete, the solvent may be removed from the precursor layer by drying at ambient temperatures or by forced evaporation, e.g. in a warm air oven. The dried layer may then be sintered directly or, alternatively, the sintering operation may be preceded by a lower temperature heat treatment designed to burn out any organic polymer which may have been used in the coating composition. Suitable temperatures for burning out any organic polymer have been described above.

In yet another preferred embodiment, some of the particulate starting materials for a given superconducting ceramic material are blended together, as described above, and the resulting powder blend, after removal of any liquid medium used in the blending operation, is heat-treated in order to partially or fully react the starting materials. The material thus formed is then blended with the remaining starting material(s), e.g. by vibro-milling in a liquid medium, and the resulting powder blend, optionally after removal of any liquid medium used in the blending operation, formulated into a coating composition together with a vehicle. Thereafter, the operations described above are used to form the superconducting thick film.

Where the partially reacted material is formed by partially reacting a blend comprising each of the starting materials for a particular ceramic, the degree of reaction of the constituent starting materials may vary within wide limits. Partial reaction of the blend of starting materials gives rise to the presence of intermediate compounds. The presence of the intermediate compounds and of unreacted starting materials in the partially reacted material can be detected by x-ray diffraction or by thermogravimetric and differential thermal analysis. A measure of the degree of reaction can be estimated from the amount of these intermediate compounds which are present. Therefore, it is possible to subject test samples of the blended starting materials to varying heat treatments, analyze the treated samples, and use this information to select a heat-treatment program, which causes only partial reaction of the starting materials.

The heating program, which is employed to effect partial reaction of a powder blend comprising each of the constituent starting materials for a particular superconducting ceramic material, will, of course, depend on the reactivity of those starting materials and the degree of reaction which is sought. In the case of $YBa_2Cu_3O_x$, if the starting materials therefor are heated in air to temperatures of about 920°–940° C. or above for a sufficient length of time, the reaction of those materials proceeds to completion and phase-pure $YBa_2Cu_3O_x$ is formed. At temperatures below 920°–940° C., the reaction of the starting materials tends to be incomplete leading to the formation of a material which typically comprises $YBa_2Cu_3O_x$, unreacted starting materials, and intermediary compounds. Accordingly, a partially reacted precursor material for $YBa_2Cu_3O_x$ can be prepared by heating a powder blend of yttrium, barium, and copper compounds in air to a temperature below about 920° C., preferably below about 900° C. Where temperatures below about 920° C. and in particular below about 900° C. are employed, the sintering of the so-formed partially reacted material results in a superconducting thick film having a particularly low surface resistance compared with the thick films which normally result when known processes are employed. The degree of reaction will also depend on the length of calcination. For instance, a material calcined at 940° C. for only one hour will not exhibit the amount of reacted starting materials that would be present after calcination for 16 hours.

For relatively low input powers, a $YBa_2Cu_3O_x$ film thickness of approximately 50–60 microns is desirable for achieving a low surface resistance ($R_s$) material. Films which have not been doped (i.e. with silver) and are less than 50 microns tend to have relatively high surface resistances. Films slightly thicker than 60 microns may be desirable for achieving low surface resistances at relatively high powers of microwave frequencies. Slightly thicker films may also be used (about 100 microns) if higher critical current density ($J_c$) is desired.

The precursor layer is sintered by heating, e.g. in a furnace, to a temperature which is at or above the peritectic temperature for the final ceramic material. The peritectic temperature will depend on the nature of the ceramic material and the atmosphere, but in the case of $YBa_2Cu_3O_x$, it is around 1025° C. in an atmosphere of oxygen at one atmosphere pressure. The temperature of the furnace is normally raised gradually, e.g. at 10° C. per minute, to the final desired temperature, which for $YBa_2Cu_3O_x$ is between 1030° and 1055° C., and typically maintained at this temperature for a few minutes. The sintering process may be carried out in an oxygen atmosphere at one atmosphere pressure, may be carried out in an oxygen atmosphere at pressures below one atmosphere, or in mixed gas atmospheres containing oxygen, or in a vacuum. After the sintering operation is complete, the sintered ceramic product is allowed to cool gradually, e.g. at a rate of 2° C. per minute, to room temperature.

The sintering encourages the reaction of any unreacted starting materials or intermediary compounds contained in the precursor layer to form the ceramic material and, moreover, will coalesce the particles forming that layer. At least in the case where the precursor layer is for a $YBa_2Cu_3O_x$ superconductor, the sintering operation also leads to the formation of a liquid phase which solidifies on cooling.

Suitable substrates are made from those materials which are relatively unreactive at the temperatures employed for the sintering process so that they do not contaminate the precursor layer during that process to an extent which impairs the performance of the final thick film. Suitable materials may be selected from magnesium oxide (MgO), alumina ($Al_2O_3$), lanthanum aluminate ($LaAlO_3$), yttria-stabilized zirconia and silver, or other metallic substrate with a suitable barrier layer. Yttria-stabilized zirconia substrates are particularly preferred.

A planar substrate may be prepared by mixing a particulate substrate material, or the precursors therefor, with an organic polymer, and a liquid which is a solvent or dispersant for the polymer to produce a deformable dough which is then rolled or pressed flat. Substrates of the desired shape and dimensions may then be cut out of the dough layer and sintered by heating at an elevated temperature in an oxygen-containing atmosphere. The sintering process will, of course, also convert the precursors to the substrate material where such are used. For example, yttria-stabilized zirconia substrates can be prepared in this manner by heating a suitably shaped and sized dough layer containing polymer-bound, yttria-stabilized zirconia powder in an oxygen containing atmosphere to a temperature of around 1450° C. If desired, the dough layer may be subjected to a lower temperature heat treatment designed to burn out the organic polymer prior to sintering the particles.

Curved substrates, e.g. a shaped wire or tube, may be produced from a particulate substrate material, or from precursors therefor, by processes which are conventional in the ceramics processing art, for example, by powder pressing or by isostatic pressing. For example, the particulate substrate material, or precursors therefor, may be pressed into a mold of the desired shape at elevated pressure and then sintered by heating at elevated temperatures in an oxygen containing atmosphere. In an alternative process for preparing a curved substrate in the form of a shaped wire or tube, the wire or tube is formed by shaping, e.g. extruding, a composition comprising the particulate substrate material, or precursors therefor, a liquid, and an organic polymer which is soluble or dispersible in the liquid. The so-formed wire or tube may then be sintered by heating at an elevated temperature in an oxygen-containing atmosphere. If desired, the polymer-containing wire or tube may be subjected to a lower temperature heat treatment designed to burn out the polymer prior to sintering the particles.

Curved substrates may be coated with superconductor material or its precursors by use of a curved doctor blade as shown in the present assignee's co-pending U.S. patent application Ser. No. 08/551,372. It will be appreciated, of course, that the thick film, which is prepared in accordance with the process of the present invention, does not have to cover the entire area of the substrate on which it is supported and may, for example, take the form of a track or strip. A thick film having a particular shape, may be prepared by employing a suitable mask during the coating process.

The present invention is now illustrated, but not limited by the following examples.

All the following examples illustrate the preparation of yttrium-barium-copper oxide ($YBa_2Cu_3O_x$) superconducting thick films on planar yttria-stabilized zirconia substrates. Yttrium oxide ($Y_2O_3$), barium carbonate ($BaCO_3$), and copper oxide (CuO) powders were used as the starting materials for the $YBa_2Cu_3O_x$ thick film. A homogeneous powder blend including one part yttrium oxide, four parts barium carbonate, and six parts copper oxide on a molar basis (yttrium:barium:copper molar ratio of 1:2:3) was prepared by vibro-milling the starting materials in absolute ethanol for 4 hours. After 4 hours, the ethanol was removed on a rotary evaporator leaving a dry powder (hereinafter Batch A) from which samples were taken for each of the following Examples.

EXAMPLES 1 TO 3

These examples illustrate the preparation of a $YBa_2Cu_3O_x$ superconducting thick film of low-surface resistance by sintering a precursor layer comprising a partially reacted material above the peritectic temperature of $YBa_2Cu_3O_x$.

In each of Examples 1 to 3, a 100 g sample of Batch A was heated in a programmable furnace in an atmosphere of air in order to partially react the yttrium oxide, barium carbonate, and copper oxide starting materials. The temperature of the furnace was increased at a rate of 10° C./minute to a selected final temperature, and maintained at this final temperature for 16 hours. The final furnace temperature was different for each example so as to result in a different degree of reaction of the starting materials. Final furnace temperatures of 860°, 880°, and 900° C. were employed in Examples 1, 2, and 3, respectively.

After the heat treatment, each sample was slowly cooled in the confines of the furnace and then reground by vibro-milling in ethanol for 16 hours. The ethanol was removed on a rotary evaporator, and the resulting dry powder was then mixed thoroughly with a vehicle comprising a polymer and solvent therefor to form a homogeneous coating composition. The final coating composition contained 80% by weight of the powder and 20% by weight of the vehicle.

A coating comprising the partially reacted material was then deposited on one major face of a planar yttria-stabilized zirconia substrate by doctor blading. The deposited coating (precursor layer) was dried and then sintered by heating in a programmable furnace in an atmosphere of oxygen. During the sintering process, the temperature of the furnace was increased at a rate of 10° C./minute to 1050° C. and maintained at this final temperature for 6 minutes. The coated substrate was then allowed to cool to ambient or room temperature in the confines of the furnace at a rate of 2° C./minute, and the so-formed $YBa_2Cu_3O_x$ thick film was measured for surface resistance. The surface resistance for each of the thick films prepared in Examples 1 to 3 is given in Table 1.

EXAMPLE 4

This example illustrates the preparation of a $YBa_2Cu_3O_x$ superconducting thick film of low surface resistance by sintering a precursor layer comprising the unreacted starting materials for $YBa_2Cu_3O_x$ above the peritectic temperature of the $YBa_2Cu_3O_x$.

A coating composition was made directly from a 100 g sample of Batch A by thoroughly mixing the powder blend with a vehicle comprising a polymer and solvent therefor. The final coating composition contained 73% by weight of the powder and 27% by weight of the vehicle. More vehicle is necessary to achieve an ink of the desired viscosity since the uncalcined material has smaller particles, and thus more surface area.

The coating composition was then used to deposit a coating (precursor layer) on one major face of a planar yttria-stabilized zirconia substrate by doctor blading. The resulting layer was dried and then sintered using the procedure described above in relation to Examples 1 to 3. The surface resistance of the thick film, thus prepared, is given in Table 1.

COMPARATIVE EXAMPLES C1 and C2

These Comparative Examples illustrate the preparation of a $YBa_2Cu_3O_x$ superconducting thick film by sintering above its peritectic temperature a layer comprising fully reacted or calcined $YBa_2Cu_3O_x$.

The same procedure as was used in Examples 1 to 3 was used to prepare a $YBa_2Cu_3O_x$ superconducting thick film, except that the 100 g samples taken from Batch A were heated to a temperature of 920° C. in Comparative Example C1, and 940° C. in Comparative Example C2, for 16 hours, so as to fully convert the constituent starting materials to $YBa_2Cu_3O_x$.

The surface resistance for each of the thick films prepared is given in Table 1.

TABLE 1

| Example No. | Surface Resistance ($R_s$) in mOhm (mO) at 77K and 18.5 GHz |
|---|---|
| 1 | 12.8 |
| 2 | 13.4 |
| 3 | 19.6 |
| 4 | 6.5 |
| C1 | 30.3 |
| C2 | 27.5 |

As can be seen from Table 1, the surface resistance of the superconductor materials increases with increased calcination temperature. The sample which was not calcined prior to sintering (Example 4), exhibited the lowest surface resistance. Examples C1 and C2, which were calcined at high temperatures as is conventional in the prior art, exhibited the highest surface resistance. It is also believed that achieving higher critical current density ($J_c$) may be achieved by partially calcining the raw materials prior to the melt processing.

EXAMPLES 5 TO 7

Examples 5–7 were made in accordance with the method of Examples 1–3, where Example 5 had a calcination temperature of 820°, Example 6 had a calcination temperature of 840°, and Example 7 had a calcination temperature of 860°. After calcination, but prior to sintering, the amount of barium carbonate in each sample was measured using x-ray diffraction and compared to the amount of barium carbonate present prior to calcination. Table 2 shows the barium carbonate relative weight percent (as compared to barium carbonate weight prior to calcining) for each example.

TABLE 2

| Example No. | $BaCO_3$ Relative Weight Percent |
|---|---|
| 5 | 75 |
| 6 | 63 |
| 7 | 49 |

As seen from Table 2, the amount of barium carbonate, and hence the amount of starting material present after calcination decreases with increasing calcination temperature. The presence of barium carbonate confirms that the starting materials have not been fully reacted to the chemical compositions of the superconducting material, in this case $YBa_2Cu_3O_x$. Combining the information from Tables 1 and 2, it is clear that a low surface resistance is obtained for a superconductor material when sintering takes place on a layer which contains unreacted starting material, or at least materials which have not been fully reacted to the chemical composition of the superconductor material.

Although the lowest surface resistance was obtained for the above examples with uncalcined materials, it may be desirable to partially calcine. Subsequent to the examples discussed above, applicants have measured surface resistances of from 5–8 mOhm at 18.5 kHz and 77 k for material calcined at 860°. Such performance is on a par with that achieved for uncalcined material. In addition, to obtain the correct rheological properties of the ink necessary for good coverage and flow, the surface area and particle size distribution of the powder should be carefully controlled. The particle size of the various starting materials may be quite different and somewhat variable. The surface areas of the uncalcined material may be high, due to the particle sizes. Partially calcining, not only causes some reaction, but also coarsens the particles considerably. The partially calcined material can then be ground or milled, as described above, to achieve the correct powder granulometery.

Referring now to FIG. 1, a superconducting structure 10 is disclosed, which has been made in accordance with the method of the present invention. The superconducting structure 10 is made of a high-temperature superconducting material, for instance $YBa_2Cu_3O_x$, where at least a portion of the starting materials for that superconducting material were not fully reacted prior to the sintering above the peritectic temperature of the superconducting material, as is described above. The structure 10 may be a substrate with a coating of superconducting material, or may be bulk superconducting material. The structure 10 has a relatively low surface resistance, and is therefore suitable as a resonator, antenna, or other device operating with RF or microwave signals as shown in FIG. 1.

The structure 10 is subject to an electromagnetic field indicated generally at 12. The electromagnetic field is generated by a field generator 14, which generates the field 12 based on signals received from signal source 16. The signal source 16 may be any of a variety of devices including a microwave or radio frequency antenna, receiver, amplifier, or may be the ultimate generator of signals. The field generator 14 may be any device which creates an electromagnetic field such as an antenna or a coupling loop into a resonant structure. When the electromagnetic field is created, currents are induced on the surface of the structure 10. The low surface resistance of the surface 10 results in less heat generation and decreased loss of the electromagnetic signal.

The structure 10 couples, either directly or indirectly, a signal to signal receiver 18. Coupling between the structure 10 and the signal receiver 18 may be accomplished in a variety of ways. For instance, if the structure 10 is an antenna, coupling may occur by attaching a conductor or superconductor between the superconducting structure 10 and the signal receiver 18. If the superconducting structure 10 is part of a resonator, coupling may be accomplished by placing the structure 10 adjacent a coupling loop, which is connected to the signal receiver. The structure 10 may generate its own electromagnetic field as a result of currents on its surface, and such field may induce current on the coupling loop. The signal receiver 18 may be an antenna, an amplifier, a resonant structure, a filter, etc. It is also possible to utilize the superconducting structure 10 in a device or system which does not have a signal receiver. For instance, the superconducting structure may be a shield located adjacent a field and may serve as a low-loss structure for enclosing that field.

The superconducting structure 10 must be kept at or below the critical temperature of the superconducting material. It may also be desirable to house the superconducting structure 10 in housing for shielding purposes or to create vacuum around the structure 10.

The foregoing detailed description has been given for clearness of understanding only, and no unnecessary limitations should be understood therefrom, as modifications would be obvious to those skilled in the art.

We claim:

1. A method of producing a ceramic superconductor material wherein the superconducting material has a chemical composition and a peritectic temperature, the method comprising the steps of:

(a) blending together starting materials for the superconducting material to produce a blend;

(b) forming the blend into a layer; and (c) heating the layer to a first temperature which is at least as high as the peritectic temperature of the ceramic superconductor material;

wherein at least a substantial portion of the starting materials is not fully reacted to the chemical composition of the superconducting material prior to the heating of the layer to the first temperature.

2. The method of claim 1 wherein at least a substantial portion of the starting materials is unreacted prior to the heating of the layer to the first temperature.

3. The method of claim 2 wherein all of the starting materials are completely unreacted prior to the heating of the layer to the first temperature.

4. The method of claim 1 wherein step (a) comprises combining the starting materials with a solvent and then drying to form a powder blend of starting materials.

5. The method of claim 1 wherein:

the blend is made into a partially reacted blend by heating to a second temperature for a period of time; and the second temperature and time are chosen such that at least a portion of the starting materials remains unreacted after such heating.

6. The method of claim 4 wherein:

the partially reacted blend is mixed with a vehicle to form an ink blend; and the ink blend is applied to a substrate to form the layer.

7. The method of claim 1 comprising:

heating the layer from room temperature at about 10° C. per minute to the first temperature in step (c);

holding the layer at the first temperature for a period of time; and cooling the layer at about 2° C. per minute to room temperature.

8. A method of producing $YBa_2Cu_3O_x$ superconducting material, wherein x is between about 6.5 and about 7.2 and $YBa_2Cu_3O_x$ has a peritectic temperature, the method comprising:

(a) blending together starting materials for the $YBa_2Cu_3O_x$ to form a blend;

(b) applying the blend to a substrate to form a layer;

(c) heating the layer to a first temperature which is at least as high as the peritectic temperature;

wherein at least a substantial portion of the starting materials is not fully reacted to $YBa_2Cu_3O_x$ prior to the heating of the layer to the first temperature.

9. The method of claim 8 wherein at least a substantial portion of the starting materials is unreacted prior to the heating of the layer to the first temperature.

10. The method of claim 9 wherein all of the starting materials are completely unreacted prior to the heating of the layer to the first temperature.

11. The method of claim 8 wherein step (a) comprises combining the starting materials with a solvent and then drying to form a powder blend of starting materials.

12. The method of claim 8 wherein:

the blend is made into a partially reacted blend by heating to a second temperature for a period of time; and the second temperature and time are chosen such that at least a portion of the starting materials remain unreacted after such heating.

13

13. The method of claim 12 wherein:

the partially reacted blend is mixed with a vehicle to form an ink blend; and the ink blend is applied to a substrate to form the layer.

14. The method of claim 8 comprising:

heating the layer from room temperature at about 10° C. per minute to the first temperature;

holding the layer at the first temperature for a period of time; and cooling the layer at about 2° C. per minute to room temperature.

15. The method of claim 14 wherein:

the layer is heated in an atmosphere of oxygen of about 1 atmosphere; and the first temperature is at least 1025° C.

16. A method of producing $YBa_2Cu_3O_x$ superconducting material, wherein x is between 6.5 and 7.2, and $YBa_2Cu_3O_x$ has a peritectic temperature, the method comprising the steps of:

(a) blending together $Y_2O_3$, $BaCO_3$, and CuO to form a blend;

(b) applying the blend to a substrate to form a layer; and (c) heating the layer to a first temperature which is at least as high as the peritectic temperature;

wherein at least a substantial portion of the $Y_2O_3$, $BaCO_3$, or CuO is not fully reacted to $YBa_2Cu_3O_x$ prior to heating the layer to the first temperature.

17. The method of claim 16 wherein at least a substantial portion of the $Y_2O_3$, $BaCO_3$, or CuO is unreacted prior to the heating of the layer to the first temperature.

18. The method of claim 17 wherein the $Y_2O_3$, $BaCO_3$, and CuO remain completely unreacted prior to the heating of the layer to the first temperature.

19. The method of claim 16 wherein the $Y_2O_3$, $BaCO_3$, and CuO are blended together by mixing them with ethanol and then drying to form a powder blend of $Y_2O_3$, $BaCO_3$, and CuO.

14

20. The method of claim 16 wherein:

the blend is made into a partially reacted blend by heating to a second temperature for a period of time; and the second temperature and time are chosen such that at least a portion of the $Y_2O_3$, $BaCO_3$, or CuO remain unreacted after such heating.

21. The method of claim 20 wherein:

the second temperature is no more than about 920°–940° C.; and the time is no more than about 16 hours.

22. The method of claim 21 wherein the second temperature is no more than about 900° C.

23. The method of claim 22 wherein the second temperature is no more than about 880° C.

24. The method of claim 23 wherein the second temperature is no more than about 860° C.

25. The method of claim 20 wherein:

the partially reacted blend is mixed with a vehicle to form an ink blend; and the ink blend is applied to a substrate to form the layer.

26. The method of claim 16 wherein:

the blend is mixed with a vehicle to form an ink blend; and the ink blend is applied for a substrate to form the layer.

27. The method of claim 16 wherein:

the first temperature is at least about 1025° C.; and the layer is heated in an atmosphere of oxygen of about one atmosphere.

28. The method of claim 22 wherein the first temperature is at least about 1050° C.

* * * * *